United States Patent
Weigen

(10) Patent No.: US 8,686,344 B2
(45) Date of Patent: Apr. 1, 2014

(54) PROCESSING METHOD AND APPARATUS FOR ENERGY SAVING OF AN ACTIVE INFRARED INDUCTION INSTRUMENT POWERED BY A DRY BATTERY

(75) Inventor: Chen Weigen, Shanghai (CN)

(73) Assignee: Shanghai Kohler Electronics, Ltd., Shanghai (CN)

( * ) Notice: Subject to any disclaimer, the term of this patent is extended or adjusted under 35 U.S.C. 154(b) by 0 days.

(21) Appl. No.: 13/618,316

(22) Filed: Sep. 14, 2012

(65) Prior Publication Data

US 2013/0009061 A1    Jan. 10, 2013

Related U.S. Application Data

(63) Continuation of application No. 13/285,965, filed on Oct. 31, 2011, now Pat. No. 8,274,036, which is a continuation of application No. 12/297,474, filed as application No. PCT/IB2007/001020 on Apr. 19, 2007, now Pat. No. 8,049,155.

(30) Foreign Application Priority Data

Apr. 20, 2006    (CN) .......................... 2006 1 0025857

(51) Int. Cl.
*G01J 1/44*    (2006.01)
*G01J 5/00*    (2006.01)
*H03K 3/017*   (2006.01)

(52) U.S. Cl.
USPC .................... 250/214 R; 250/338.1; 327/172

(58) Field of Classification Search
USPC .......... 250/338.1, 341.8, 342, 559.47, 214 R, 250/214.1, 214 SW, 214 LS, 214 A, 214 LA, 250/214 AL, 214 C, 214 RC, 214 B, 208.1; 348/307, 308, 309; 330/2, 75, 85, 102, 330/184, 307; 327/172, 416, 536

See application file for complete search history.

(56) References Cited

U.S. PATENT DOCUMENTS

| 2,544,448 A | 4/1945 | Downey |
| 3,842,346 A | 10/1974 | Bobbitt |

(Continued)

FOREIGN PATENT DOCUMENTS

| CN | 2311077 Y | 3/1999 |
| CN | 2455985 | 10/2001 |

(Continued)

OTHER PUBLICATIONS

Non Final Office Action mailed Nov. 20, 2012 in U.S. Appl. No. 12/297,465.

(Continued)

*Primary Examiner* — Kevin Pyo
*Assistant Examiner* — Don Williams
(74) *Attorney, Agent, or Firm* — Foley & Lardner LLP

(57) ABSTRACT

An active infrared induction instrument powered by a dry battery capable of reducing power consumption through the adjustment of the emitter pulse width. The infrared emitted LED emits infrared signals, which, after being reflected by an object, are received by the infrared photodiode. The infrared signals received the infrared signals received by the infrared photodiode then enter an integrated circuit chip through a comparator. The pulse widths of the infrared emission pulse signals are dynamically adjusted after the width of the pulse series is received by the discrimination chip, thus reducing the emission power consumption to save energy.

22 Claims, 4 Drawing Sheets

(56) References Cited

U.S. PATENT DOCUMENTS

| | | | |
|---|---|---|---|
| 3,976,352 A | 8/1976 | Spinner | |
| 4,895,344 A | 1/1990 | Brand et al. | |
| 5,224,509 A | 7/1993 | Tanaka et al. | |
| 5,224,685 A | 7/1993 | Chaing et al. | |
| 5,338,979 A | 8/1994 | Mammano et al. | |
| 5,456,621 A | 10/1995 | Gan | |
| 5,458,154 A | 10/1995 | Niemann et al. | |
| 5,473,461 A * | 12/1995 | Miremadi | 398/202 |
| 5,482,250 A | 1/1996 | Kodaira | |
| 5,491,529 A * | 2/1996 | Iwai et al. | 396/59 |
| 5,566,702 A | 10/1996 | Phillip | |
| 5,963,135 A | 10/1999 | Van Marcke | |
| 5,984,262 A | 11/1999 | Parsons et al. | |
| 5,988,588 A | 11/1999 | Allen et al. | |
| 6,161,814 A | 12/2000 | Jarling | |
| 6,181,095 B1 | 1/2001 | Telmet | |
| 6,206,340 B1 | 3/2001 | Paese et al. | |
| 6,215,116 B1 | 4/2001 | Van Marcke | |
| 6,261,130 B1 | 7/2001 | Huynh et al. | |
| 6,273,394 B1 | 8/2001 | Vincent et al. | |
| 6,547,211 B2 | 4/2003 | Roman | |
| 6,710,346 B2 | 3/2004 | Brewington et al. | |
| 6,761,596 B2 | 7/2004 | Kuhbauch et al. | |
| 6,919,567 B2 | 7/2005 | Iwasawa | |

FOREIGN PATENT DOCUMENTS

| | | |
|---|---|---|
| CN | 2545727 | 4/2003 |
| CN | 2569452 Y | 8/2003 |
| CN | 1525088 A | 9/2004 |
| CN | 1862249 | 11/2006 |
| GB | 2355523 | 4/2001 |
| JP | 8138793 A | 5/1996 |
| JP | 2003-045603 A | 2/2003 |
| WO | WO2007122475 | 11/2007 |
| WO | WO2007122476 | 11/2007 |

OTHER PUBLICATIONS

International Search Report: PCT/IB2007/001020; Sep. 6, 2007; 5 pages.

The Examination Report issued by the Intellectual Property Office of New Zealand, Apr. 30, 2010, Patent Application No. 572025, 2 pages.

International Search Report: PCT/IB2007/001022; Sep. 6, 2007; 3 pages.

* cited by examiner

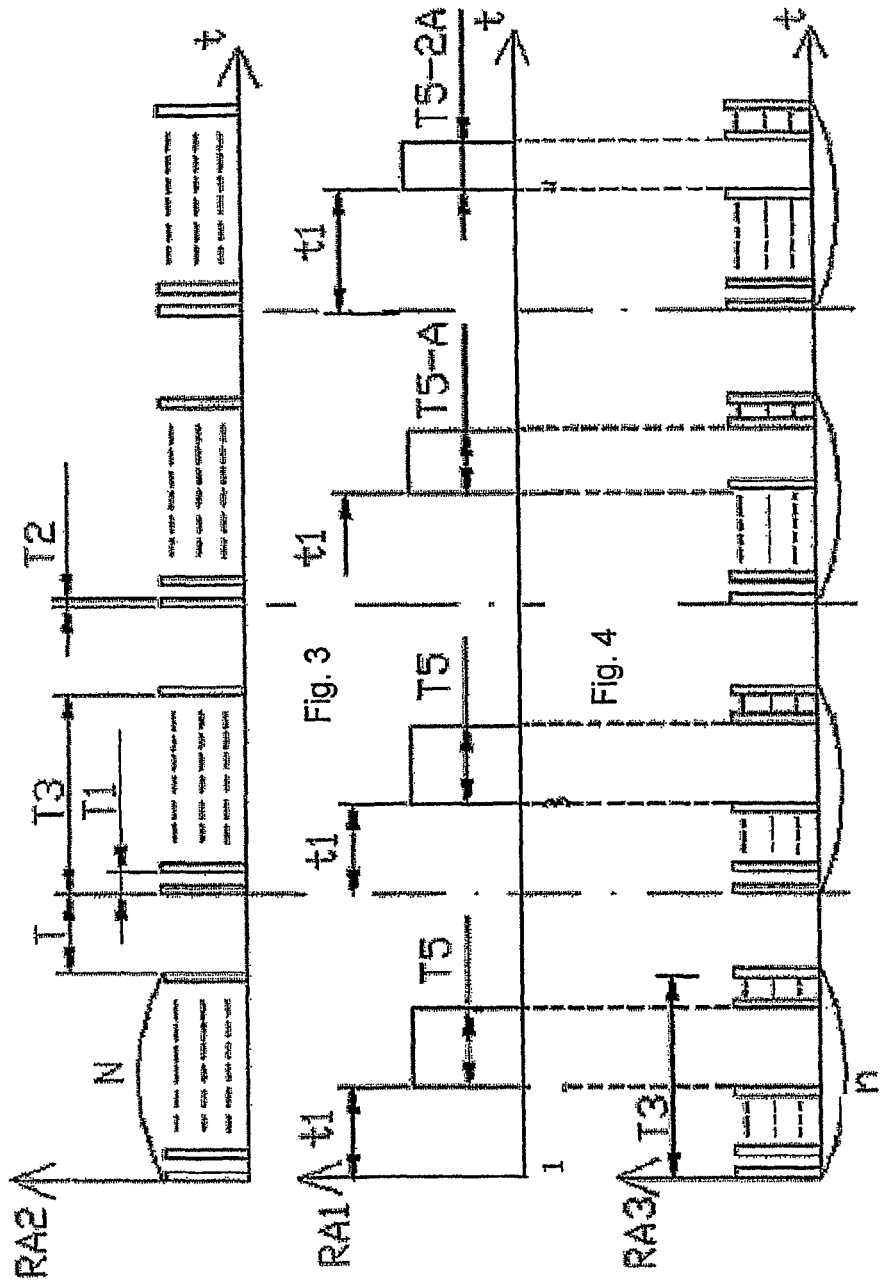

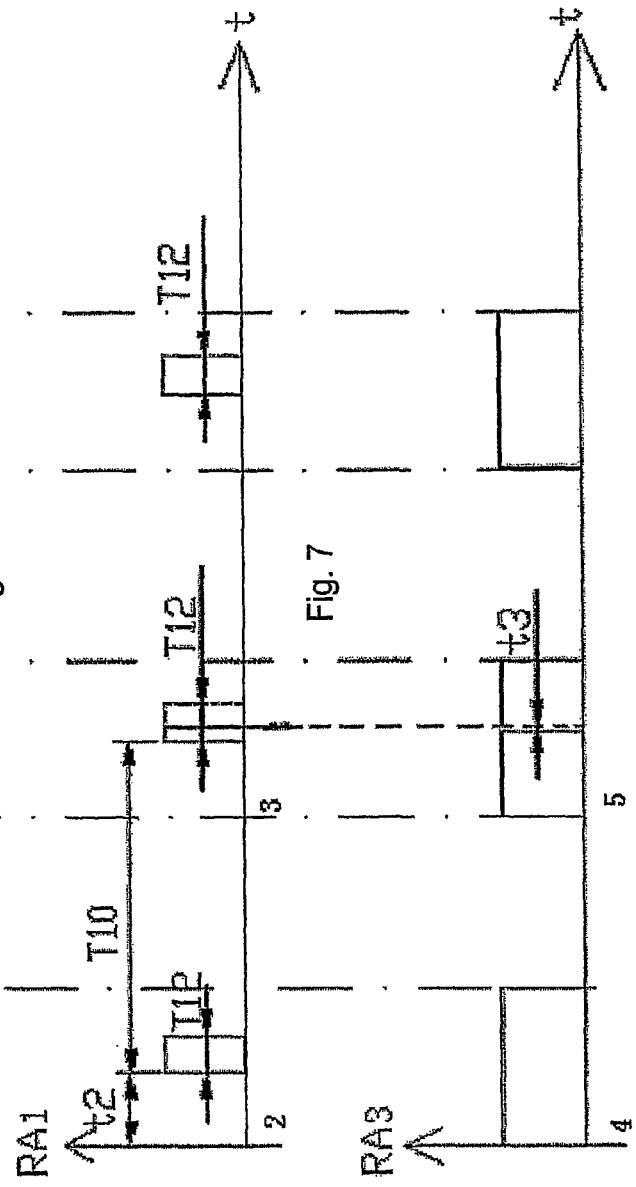

PROCESSING METHOD AND APPARATUS FOR ENERGY SAVING OF AN ACTIVE INFRARED INDUCTION INSTRUMENT POWERED BY A DRY BATTERY

CROSS-REFERENCE TO RELATED APPLICATIONS

This application is a continuation of U.S. application Ser. No. 13/285,965 filed Oct. 31, 2011, which will be U.S. Pat. No. 8,274,036, which will issue Sep. 25, 2012, which is a continuation of U.S. application Ser. No. 12/297,474 filed Feb. 20, 2009, which is now U.S. Pat. No. 8,049,155, issued Nov. 1, 2011 as a national stage of PCT/IB2007/001020, filed Apr. 19, 2007, which claims priority to Chinese Application No. CN200610025857.4 filed Apr. 20, 2006. Each of U.S. application Ser. Nos. 13/285,965, 12/297,474, International Application No. PCT/IB2007/001020, and Chinese Application No. CN200610025857.4 are hereby incorporated by reference in their entireties.

TECHNICAL FIELD

The control of active infrared induction powered by a dry battery.

BACKGROUND TECHNOLOGY

The active infrared induction approach is a pick-off approach, which through eradiation and reflection of selective infrared rays, distinguishes and controls after processing reflected signals. As the sensor of the infrared induction is powered by dry battery, the power consumption of this product becomes important. In order to extend the working life of the dry battery, it is essential to reduce the power consumption. The existing technology uses accurate calculations and modeling of each component of the hardware circuit, as well as the periodic hibernation function in the standby mode of software, to realize its power requirements.

However, the existing technology fails to adjust the infrared emission energy automatically during the active working phase, when the infrared emitting LED consumes a large ratio of the power consumption. Adjustments to the pulse amplitude and frequency have been implemented to also address power issues, but the duration of the pulses have not been previously addressed to adjust the power consumption of the infrared emitting LED. Further, multiple components are utilized and often implement multiple scanning rates and multiple sensors to compare transmitted and received pulses. Such a system requires more components and more complicated software for regulation. Even utilizing this method, the pulse width is not adjusted which is an area that is ripe for optimization to utilize power and lower power consumption especially when using a dry battery.

INVENTION CONTENT

It is the intention of at least an embodiment of the present invention to be based on the optimization of the hardware circuit and the use of the dormancy of the software. It is an approach to reduce the power consumption by dynamically adjusting the pulse width of the infrared emission through distinguishing and processing the strength of the infrared receiving signal on the basis of use reliability. It is the intention of at least an embodiment of the present invention to be used to adjust the pulse width of the infrared I emission through distinguishing the strength of the infrared receiving signal. During this process, the distinguishing of the strength of the receiving signal is realized by software enactment after a large number of experiments.

SUMMARY OF THE INVENTION

It is the intention of at least a preferred embodiment of the present invention to provide an electrical circuit having an emitting diode, infrared receiver and an integrated circuit ("IC"). The circuit preferably has a transistor connected between the emitting diode and one input of the IC. The circuit preferably has an operational amplifier and a comparator located between the infrared receiver and the IC. The comparator outputs to a transistor which outputs to two inputs of the IC. Based on the strength of the received signal by the infrared receiver, the IC can adjust the pulse width of the emitting diode dependent on the type of IC used.

If an interrupting IC is used, the IC will use a real-time approach to adjust the pulse width. Whereas, if a non-interrupting IC is used, the IC will use a time-lag approach to adjust the pulse width. This approach allows the IC to dynamically adjust the pulse width during its active phase allowing for the lowering of battery consumption.

BRIEF DESCRIPTION OF THE DRAWINGS

Drawing

Drawing

Drawing FIG. 3 is a time sequence diagram of the pulse emitted from RA2 when the circuit (1) of the output signal of the comparator (A2) of FIG. 1 is composed as in FIG. 2.

Drawing FIG. 4 is a time sequence diagram of the pulse emitted from RA1 when the circuit (1) of the output signal of the comparator (A2) of FIG. 1 is composed as in FIG. 2.

Drawing FIG. 5 is a time sequence diagram of the pulse emitted from RA3 when the circuit (1) of the output signal of the comparator (A2) of FIG. 1 is composed as in FIG. 2.

Drawing FIG. 6 is an operational amplifier reference level time sequence diagram of the circuit (1) of the output signal of the comparator in FIG. 2 when it is composed of one wire.

Drawing FIG. 7 is a time sequence diagram of the pulse emitted from RA1 when the circuit (1) of the output signal of the comparator (A2) in FIG. 2 is composed of one wire.

Drawing FIG. 8 is a time sequence diagram of the pulse emitted from RA2 when the circuit (1) of the output signal of the comparator (A2) in FIG. 2 is composed of one wire.

Drawing

DETAILED DESCRIPTION OF THE PREFERRED EMBODIMENTS

Figure 1:
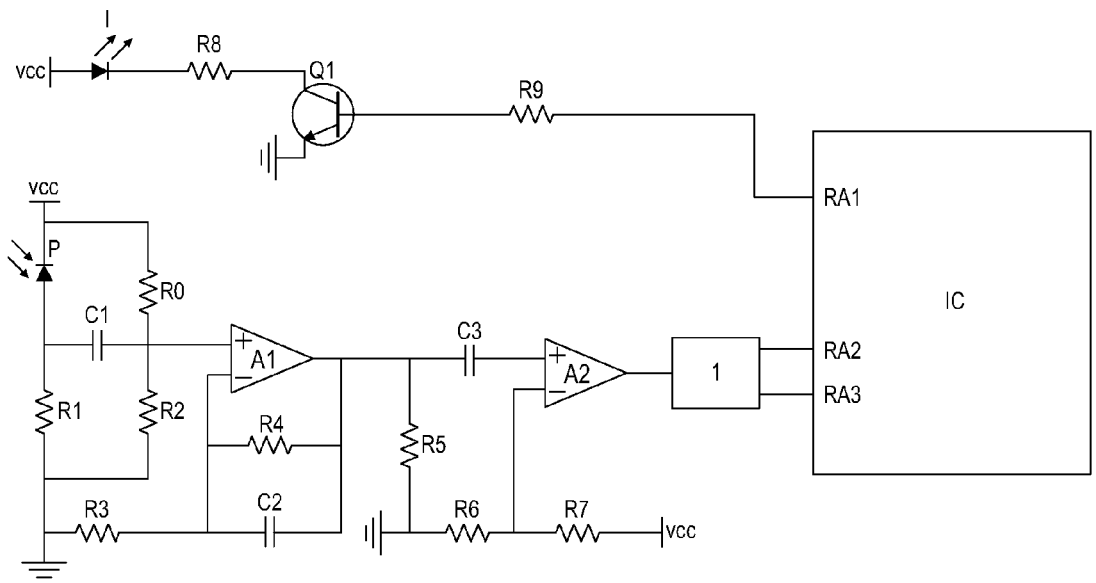
FIG. 1 is a schematic diagram of the hardware of the infrared emission-receiving process.
Figure 2:
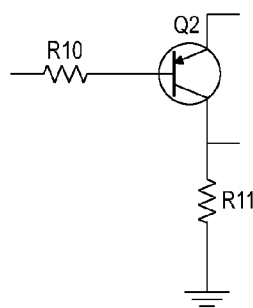
FIG. 2 is a partial plan of the circuit (1) of FIG. 1.

The present invention can be realized in two embodiments. The present invention can adjust the pulse width of the infrared emission by distinguishing the strength of the infrared receiving signal through a continuous section of pulse series. The schematic for the circuit hardware is illustrated in FIG. 1. The circuit 1 for detection and identification of signals is illustrated in FIG. 2. In FIG. 3, after the power-on initialization, input 2 RA2 of the CSM IC outputs a pulse series composed of N pulses with a period T1 and a pulse width T2. The total time of this group of pulse series is T3, as in FIG. 3. The interval time between every two groups is T. T1 seconds after RA2 outputs the first pulse, input 1 RA1 will output a pulse signal whose period is (T+T2+T3) and pulse whose pulse width is T5. The NPN transistor Q1 will be turned on and drive the emitting diode I. The infrared receiver P receives the infrared ray and transforms it into an electrical signal. The electrical signal passes. through the filter circuit composed of resistance R1 and capacitance C1, and the operational amplifier reference level circuit composed of resistor R0 and R2 in turn, and is inputted to the positive input of the operational amplifier A1. The signal then passes through a negative feedback loop composed of resistors R3 and R4 and capacitor C3 and is inputted into the positive input of the comparator A2. After the signal is compared with a reference voltage of the comparator at the negative input, a divider circuit that is composed of resistors R6 and R7 supplies the reference voltage; the signal is output to the base of the PNP transistor Q2. When the base level of the transistor Q2 is lower than the emitter level of the transistor Q2, the transistor Q2 is turned on and input 3 of the CSM IC RA3 collects pulse signals of the collector of the count unit Q1. The number of pulses collected here is recorded as n. When the base level of the transistor Q2 is higher than the emitter level of the transistor Q2, the transistor Q2 is cut off and RA3 collects no pulse signals.

Figure 9:
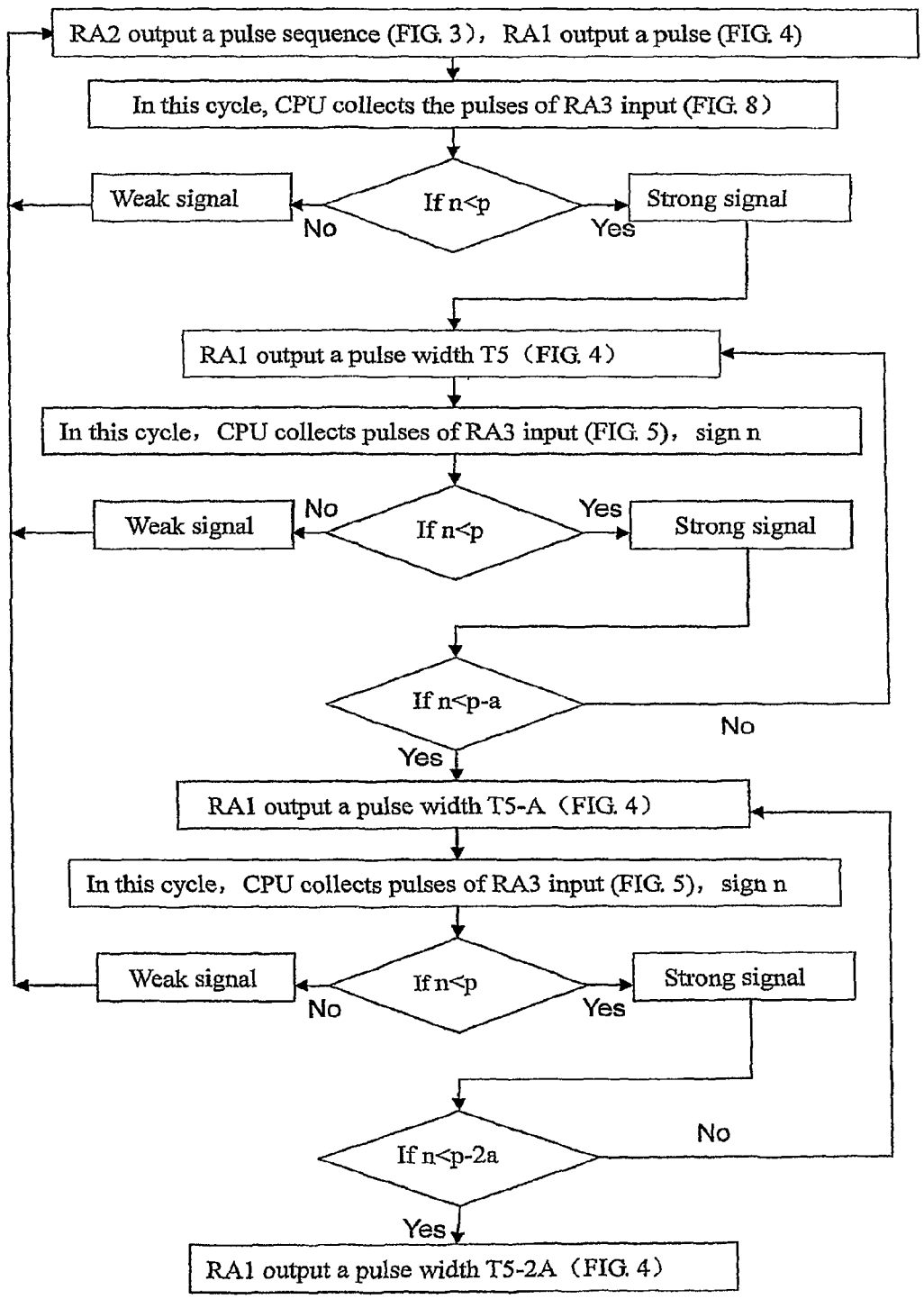
FIG. 9 is about two process cycles of the circuit (1) of the output signal of the comparator (A2) in FIG. 1 when circuit (1) is composed as in FIG. 2. In the drawings, (I) emitting diode; (P) infrared receiver; (R8) resistor; (O1) NPN Transistor; (R9) resistor; (RA1) input one of IC; (RA2) input 2 of IC; (RA3) input three of IC; (RO) resistor; (R1) resistor; (C1) capacitor; (R2) resistor; (R3) resistor; (R4) resistor; (C2) capacitor; (A1) operational amplifier; (C3) capacitor; (R5) resistor; (R6) resistor; (A2) comparator; (A7) resistor; (1) circuit containing (R10) resistor; (O2) PNP transistor; (R11) resistor; (n) pulses collected; (T10) pulse signal period; (T11) pulsed signal width; (T12) pulse width; (N) number of pulses; (T1) pulse period; (T2) pulse width; (T3) total of T1 and T2; (T) interval time between two groups; (T5) pulse width of RA1 output

After collection, the pulse signal is judged by software on the IC. The symbols, p, A, a are the data gathered after a large number of pulse collections (experiments). p is the originally set comparative number of the pulses. A is the RA1 pulse width which decreases correspondingly in the SCM IC. a is the set number of the pulses that are decreasing progressively. The process uses the number of the pulses collected (n) to judge the strength of the received signals. When n>p, the signal is weak and the number of pulses will be recollected. When n::S p, the signal is strong. The specific judging steps are illustrated in FIG. 9, which displays about two cycles. The rest of the cycles suppose the number of pulse signals at the input of RA3 is n. The number of collected pulses (n) is used to judge the strength of the received signals. If the signal is weak, the number of pulses will be recollected. If the signal is strong, n will be compared with (p−(m+1)a); if n<<p−(m+1)a), RA1 will minus A from the original emitting pulse width (T5-ma), and continue to collect the pulse of the RA3 input. The dynamic adjustment narrows the width of the emitting pulse in order to achieve the ideal energy saving effect. If n~(p−(m+1)a), the width of the pulse from RA1 will be (T5-ma) and the aforementioned circulation will continue. This method is a time-lag approach by distinguishing the fluctuation of the emitting level pulse. This method costs less than implementing an IC that possesses interrupting functionality. A method utilizing an interrupting IC is also disclosed.

The present invention may adjust the pulse width of the infrared emission in a real-time method by distinguishing the change of the receiving signals and causing the SCM IC to interrupt. The schematic for the circuit hardware is illustrated in FIG. 1. The circuit 1 of the output signal of the comparator A2 is composed of a wire connected to the third input RA3 of the IC. The second input RA2 floats. The operating principle is that after power-on initialization, as a reference level voltage (V) synchronous to the infrared receiver P (a pulse signal, whose period is T10 and pulse width T11, output from a pin of the SCM IC) is overlaid at the input end of the operational amplifier A1, the reference level is composed of a divider resistance RO and R2 and its period and pulse width is T10 and T11. After a 2-second delay, RA1 of the SCM IC outputs a high level pulse, whose period is T10 and pulse width T12. At this moment, the NPN transistor Q1 is turned on, thus driving the emitting diode I. After the voltage signal transformed from the infrared ray received by the infrared receiver passes through the filter circuit composed of resistor R1 and capacitor C1, and the divider resistors RO and R2, the voltage signal enters the positive input of the operational amplifier A1. The signal then passes through the negative feedback circuit composed of resistors R3 and R4 and capacitor C3 by the output of the operational amplifier A1. The signal then enters the positive input of the comparator A2. After the signal is compared to the negative input of A2, which composes the comparator A2 with resistors R6 and R7, the result of the comparison will be output to input RA3. The SCM IC will do a real-time judgment and process according to the change of the signal. If RA3 collects no rising-edge pulse in the T11 period, the signal is judged as weak, and RA1 outputs a wave as illustrated in No.2 of FIG. 7. If RA3 collects a rising-edge pulse, as illustrated in NO.5 of FIG. 8, in the T11 period, the signal is judged as a strong one (it takes about t3 seconds to finish the process of judgment). The interruption by the SCM IC occurs according to the rising edge of the outside pulse signal detected and received by the SCM IC. The interruption immediately transforms the output of RA1 from high level to low level during this period as illustrated in NO.3 of FIG. 7. A new judgment on the change of RA3 signal will be made until RA1 resumes the level pulse during the next period. By interrupting this way, the width of the emitting pulse can be adjusted in a real-time method, so that the power consumption is reduced and the energy-saving effect is realized.

Although the processing methods of the aforementioned two approaches are different, they follow the same principle, which is to make use of the strength of the feedback signal to adjust the emitting pulse signal after distinguishing the level signal by software in order to save energy. This method reduces the power consumption of the complete machine and prolongs the working life of the dry battery by way of automatically adjusting the width of the infrared emitting pulse by software.

Although the present invention has been shown and described herein by way of preferred embodiments, it is understood that the invention may be modified without departing from the spirit and scope of the invention as defined in the following claims.

What is claimed is:

1. A method of energy saving in an active infrared induction instrument, comprising:
    supplying a series of electronic pulses for counting during a time period;
    preventing a subset of the electronic pulses from being counted while a photodetector circuit of the instrument detects infrared light emitted by the instrument;
    counting a number of electronic pulses not prevented from being counted during the time period; and
    adjusting a pulse width of infrared light emitted by the instrument during a future time period based on the number of electronic pulses not prevented from being counted during the time period.

2. The method of claim 1, wherein adjusting a pulse width of infrared light emitted by the instrument during a future time period based on the number of electronic pulses not prevented from being counted during the time period comprises:

comparing the number of electronic pulses not prevented from being counted during the time period with a threshold value; and when the number of electronic pulses not prevented from being counted during the time period exceeds the threshold value, reducing the pulse width of infrared light emitted by the instrument during the future time period.

3. The method of claim 2, further comprising:
repeating the supplying, preventing, counting, comparing, and reducing steps until a comparison between a new number of electronic pulses not prevented from being counted during a new time period exceeds an adjusted threshold value.

4. The method of claim 3, wherein the adjusted threshold value is calculated by:
decreasing the threshold value when the pulse width is reduced; and
increasing the threshold value when the pulse width is increased.

5. An active infrared induction instrument, comprising:
an infrared emitter;
a photodetector circuit;
a control circuit configured to:
supply regular electronic pulses for counting during a period of time;
prevent electronic pulses from being counted while the photodetector circuit detects infrared light emitted by the infrared emitter;
count a number of electronic pulses not prevented from being counted during the time period; and
adjust a pulse width of infrared light emitted by the infrared emitter during a future time period based on the number of electronic pulses not prevented from being counted during the time period.

6. The active infrared induction instrument of claim 5, wherein the control circuit is configured to compare the number of electronic pulses not prevented from being counted during the time period with a threshold value and to reduce the pulse width of infrared light emitted by the instrument during the future time period when the number of electronic pulses not prevented from being counted during the time period exceeds the threshold value.

7. The active infrared induction instrument of claim 6, wherein the control circuit is configured to repeat the supplying, preventing, counting, comparing, and reducing until a comparison between a new number of electronic pulses not prevented from being counted during a new time period exceeds an adjusted threshold value.

8. The active infrared induction instrument of claim 7, wherein the control circuit is configured to decrease the threshold value for use in the future time period when the pulse width is reduced and wherein the control circuit is configured to increase the threshold value when the pulse width is increased.

9. The active infrared induction instrument of claim 5, wherein the infrared emitter further comprises an infrared emitting LED, a first resistance, a second resistance and a transistor; and wherein the photodetector circuit further comprises a photodiode, a filter circuit, a bleeder circuit, an operational amplifier and a comparator.

10. The active infrared induction instrument of claim 9, wherein the control circuit comprises an integrated circuit chip, and wherein the base of the transistor of the infrared emitter is connected to a first interface of the control circuit.

11. The active infrared induction instrument of claim 10, wherein the first interface of the integrated circuit chip outputs a pulse series.

12. The active infrared induction instrument of claim 11, wherein if the pulse series is at a high level, the transistor will be turned on and the infrared emitter will emit an infrared ray.

13. The active infrared induction instrument of claim 12, further comprising a circuit for detection and identification of signals.

14. The active infrared induction instrument of claim 13, wherein a first end of the first resistance is connected to the output of the comparator and a second end of the first resistance is connected to the base of the transistor.

15. The active infrared induction instrument of claim 14, wherein a collector of the transistor is connected to a second interface of the integrated circuit chip, and an emitter of the transistor is connected to a third interface of the integrated circuit chip.

16. The active infrared induction instrument of claim 15, wherein a first end of the second resistance for the detection and identification of signals is connected to the emitter of the transistor and a second end of the second resistance for the detection and identification of signals is connected to ground.

17. The active infrared induction instrument of claim 16, wherein the output of the comparator is directly connected to the third interface of the integrated circuit chip.

18. The active infrared induction instrument of claim 17, wherein the integrated circuit chip lacks an interrupting function.

19. A control system for an active infrared induction instrument, the control system comprising:
a circuit configured to:
supply regular electronic pulses for counting during a period of time;
prevent electronic pulses from being counted while an infrared photo circuit of the instrument detects infrared light emitted by the instrument;
count a number of electronic pulses not prevented from being counted during the time period; and
adjust a pulse width of infrared light emitted by the instrument during a future time period based on the number of electronic pulses not prevented from being counted during the time period.

20. The control system of claim 19, wherein the circuit is configured to compare the number of electronic pulses not prevented from being counted during the time period with a threshold value and to reduce the pulse width of infrared light emitted by the instrument during the future time period when the number of electronic pulses not prevented from being counted during the time period exceeds the threshold value.

21. The control system of claim 20, wherein the circuit is configured to repeat the supplying, preventing, counting, comparing, and reducing until a comparison between a new number of electronic pulses not prevented from being counted during a new time period exceeds an adjusted threshold value.

22. The control system of claim 21, wherein the circuit is configured to decrease the threshold value for use in the future time period when the pulse width is reduced and wherein the control circuit is configured to increase the threshold value when the pulse width is increased.

* * * * *